(12) United States Patent
Kataoka et al.

(10) Patent No.: US 7,646,246 B2
(45) Date of Patent: Jan. 12, 2010

(54) SEMICONDUCTOR DEVICE

(75) Inventors: Shinichiro Kataoka, Osaka (JP);
Takehiro Yano, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/056,860

(22) Filed: Mar. 27, 2008

(65) Prior Publication Data
US 2008/0238552 A1 Oct. 2, 2008

(30) Foreign Application Priority Data
Mar. 30, 2007 (JP) .............................. 2007-094731

(51) Int. Cl.
*H03F 1/14* (2006.01)
(52) U.S. Cl. ...................................... 330/292; 330/261
(58) Field of Classification Search ................. 330/292, 330/261, 257, 253
See application file for complete search history.

(56) References Cited

U.S. PATENT DOCUMENTS

| 4,562,408 A | * | 12/1985 | Nagai et al. ................. | 330/253 |
| 6,369,558 B2 | * | 4/2002 | Umemoto ................... | 323/282 |
| 6,875,336 B2 | * | 4/2005 | Lewis et al. ................. | 205/724 |
| 6,958,651 B2 | * | 10/2005 | Kimura ....................... | 330/253 |

FOREIGN PATENT DOCUMENTS

| JP | 10-270957 | 10/1998 |
| JP | 11-097626 | 4/1999 |

* cited by examiner

*Primary Examiner*—Henry K Choe
(74) *Attorney, Agent, or Firm*—Hamre, Schumann, Mueller & Larson, P.C.

(57) ABSTRACT

A semiconductor device includes a phase compensation circuit 6 using a MOS capacitor with a structure in which an insulating film is disposed between a gate electrode formed on a semiconductor substrate and a diffusion layer. The phase compensation circuit includes first and second MOS capacitors 14, 15. A gate electrode terminal of the first MOS capacitor is connected equivalently to a diffusion layer terminal of the second MOS capacitor that is a terminal opposite to the gate electrode terminal. A potential difference generating element 16 that generates a potential difference by allowing a current to flow therethrough is connected between a diffusion layer terminal of the first MOS capacitor and a gate electrode terminal of the second MOS capacitor. When the MOS capacitors having the voltage dependence are used, e.g., as a phase compensation circuit element of an operational amplifier, the MOS capacitance is not reduced, no matter the range of the input or output voltage of the operational amplifier, so that the phase margin will not reduced.

7 Claims, 9 Drawing Sheets

SEMICONDUCTOR DEVICE

BACKGROUND OF THE INVENTION

1. Field of the Invention

The present invention relates to a semiconductor device that uses a MOS capacitor having the voltage dependence as a phase compensation circuit element of an operational amplifier or the like.

2. Description of Related Art

In a conventional semiconductor device, when a MOS capacitor is used for the phase compensation of an operational amplifier or the like, two MOS capacitors are connected in parallel with their respective terminals of opposite polarities connected to each other. The MOS capacitor is formed in a semiconductor substrate and configured by disposing an insulating film (gate oxide film) between a gate electrode and a diffusion layer. In the following, a "CMOS operational amplifier" disclosed in JP 10 (1998)-270957 A will be described as a conventional example of the semiconductor device with reference to FIG. 7.

In FIG. 7, an N-channel MOS transistor 87 and an N-channel MOS transistor 88 constitute a differential input stage, and signals from an inverting input terminal 81 and a non-inverting input terminal 82 are input to the gates of the MOS transistors 87 and 88, respectively. The source of the MOS transistor 87 and the source of the MOS transistor 88 are connected to each other, and a constant current is drawn through the drain of an N-channel MOS transistor 89. In the MOS transistor 89, a drain current is set by a voltage applied to a bias voltage input terminal 83.

The sources of P-channel MOS transistors 91, 92 are connected to a common power supply terminal 84 (higher potential power supply VDD). The drain of the MOS transistor 87 is connected to the gates of the MOS transistors 91, 92, and also to the drain of the MOS transistor 91. The drain of the MOS transistor 88 is connected to the drain of the MOS transistor 92.

The drain of the MOS transistor 88 is connected further to the gate of a P-channel MOS transistor 93, whose source is connected to the higher potential power supply VDD, and also to one terminal of a phase compensation capacitor 86. The other terminal of the phase compensation capacitor 86 is connected to the drain of the MOS transistor 93. The drain of the MOS transistor 93 is connected to the drain of an N-channel MOS transistor 90 in which a drain current is set by the voltage applied to the bias voltage input terminal 83. The node between the drains of the MOS transistors 93 and 90 is connected to an output terminal 85.

The phase compensation capacitor 86 includes two MOS capacitors 94, 95 that are connected in parallel with their respective terminals of opposite polarities connected to each other. FIG. 8 shows a cross-sectional structure of the MOS capacitors 94, 95 that serve as MOS-type capacitative elements (N well capacitative elements).

In FIG. 8, reference numeral 114 denotes a P-type semiconductor substrate in which N well layers (N-type diffusion layers having a low impurity concentration) 111, 112 and a field oxide film 113 are formed. N-type diffusion layers having a high impurity concentration (N-type diffusion layers with a small specific resistance) 107, 108 and 109, 110 are formed in the N well layers 111 and 112, respectively. A gate electrode 103 is disposed via a gate oxide film 105 in a region between the N-type diffusion layers 107 and 108. Similarly, a gate electrode 104 is disposed via a gate oxide film 106 in a region between the N-type diffusion layers 109 and 110. Terminals 101, 102 are provided for the MOS capacitors 95, 94.

The terminal 101 of the MOS capacitor 95 and the terminal 102 of the MOS capacitor 94 are connected to the gate and the drain of the MOS transistor 93 in FIG. 7, respectively.

With this configuration, when a voltage V1 i.e., the voltage of the terminal 101 of the MOS capacitor 95) is higher than a voltage VOUT (i.e., the voltage of the terminal 102 of the MOS capacitor 94), a depletion layer is formed in the N well layer 111 directly below the gate electrode 103 in the MOS capacitor 95, and the capacitance of the MOS capacitor 95 becomes extremely small. On the other hand, when the voltage V1 is lower than the voltage VOUT, a depletion layer is formed in the N well layer 112 directly below the gate electrode 104 in the MOS capacitor 94, and the capacitance of the MOS capacitor 94 becomes extremely small.

However, since the MOS capacitors 95, 94 are connected in parallel with their respective terminals of opposite polarities connected to each other, whether the voltage V1 is higher or lower than the voltage VOUT by a certain level (except for the vicinity of the same potential), the capacitance of one of the MOS capacitors is maintained at a predetermined level, namely is not reduced due to the depletion layer. That is, whether the voltage V1 is higher or lower than the voltage VOUT by a certain level (except for the vicinity of the same potential), the capacitance of the phase compensation capacitor 86 (i.e., the total capacitance of the MOS capacitors 94, 95) is maintained at a predetermined value or more. Therefore, when the semiconductor device is used as an operational amplifier or the like, it will not oscillate.

In addition to JP 10 (1998)-270957 A, JP 11 (1999)-97626 A also discloses a similar example in which a parasitic capacitance component is added using AL wiring.

However, the conventional semiconductor device as shown in FIGS. 7 and 8 has the following problems.

FIG. 9 is a characteristic diagram showing the voltage dependence of the phase compensation capacitor 86. The horizontal axis indicates a voltage (VOUT-V1), and the vertical axis indicates a capacitance. A dotted-line curve a represents the capacitance of the MOS capacitor 94, a broken-line curve b represents the capacitance of the MOS capacitor 95, and a solid-line curve c represents the capacitance of the phase compensation capacitor 86 (i.e., the total capacitance of the MOS capacitors 94, 95).

In a general MOS capacitor, if the voltage of a diffusion layer terminal is higher than that of a gate electrode terminal, a depletion layer is formed in the N well layer directly below the gate electrode. Consequently, the length L as the capacitor in combination with the thickness of the gate oxide film is increased to reduce the capacitance. The characteristics of the MOS capacitor 94, the characteristics of the MOS capacitor 95, and the capacitance of the phase compensation capacitor 86 (i.e., the total capacitance of the MOS capacitors 94, 95) are as indicated by the curves a, b, and c in FIG. 9, nothing that a small variation of the voltage dependence of the MOS capacitor may be caused according to the conditions of the impurity concentration of the N well layer, the thickness of the gate oxide film, or the like.

As shown in FIG. 9, when (VOUT-V1) is in the vicinity of 0 V, the capacitance of the phase compensation capacitor 86 is extremely small. Thus, if the operational amplifier in FIG. 7 is used, e.g., in such a way that the voltage between the terminals of the phase compensation capacitor 86 changes with the input conditions, the operational amplifier probably will oscillate under the operating conditions in which (VOUT-V1) is in the vicinity of 0 V.

To eliminate the possibility of oscillation even under the operating conditions in which (VOUT-V1) is in the vicinity of 0 V, the phase compensation capacitor 86 has to be very large, leading to an increase in the chip size.

SUMMARY OF THE INVENTION

It is an object of the present invention to provide a semiconductor device that can suppress a reduction in the total capacitance of the MOS capacitors constituting the phase compensation capacitor even under the operating conditions in which (VOUT-V1) is in the vicinity of 0 V.

A semiconductor device of the present invention includes a phase compensation circuit using a MOS capacitor with a structure in which an insulating film is disposed between a gate electrode formed on a semiconductor substrate and a diffusion layer. The phase compensation circuit includes a first MOS capacitor and a second MOS capacitor. A gate electrode terminal of the first MOS capacitor is connected to a diffusion layer terminal of the second MOS capacitor that is a terminal opposite to the gate electrode terminal. A potential difference generating element that generates a potential difference by allowing a current to flow therethrough is connected between a diffusion layer terminal of the first MOS capacitor and a gate electrode terminal of the second MOS capacitor.

According to the present invention, the gate electrode terminal of the first MOS capacitor and the diffusion layer terminal of the second MOS capacitor are connected to each other, and a potential difference is generated between the diffusion layer terminal of the first MOS capacitor and the gate electrode terminal of the second MOS capacitor. Therefore, the voltage between the terminals of the first MOS capacitor and the voltage between the terminals of the second MOS capacitor are not simultaneously in the vicinity of 0 V at any time under any operating conditions. Thus, at least one of the first MOS capacitor and the second MOS capacitor can prevent a large depletion layer (the length L is long in the vertical direction) from being formed in the N well diffusion layer directly below the gate electrode. Consequently, at least one of the MOS capacitors can maintain a predetermined capacitance.

DETAILED DESCRIPTION OF THE INVENTION

The semiconductor device of the present invention may have the following aspects based on the above configuration.

A diode may be provided as the potential difference generating element, and a forward current may be allowed to flow through the diode.

The phase compensation circuit may be used for the phase compensation of an operational amplifier.

The semiconductor device further may include a differential amplifier and a MOS transistor whose gate is driven by an output from the differential amplifier. The gate electrode terminal of the first MOS capacitor and the diffusion layer terminal of the second MOS capacitor may be connected to the gate of the MOS transistor. Either of the terminals of the potential difference generating element may be connected to the drain of the MOS transistor. The diffusion layer terminal of the first MOS capacitor may be connected to one of the terminals of the potential difference generating element. The gate electrode terminal of the second MOS capacitor may be connected to the other terminal of the potential difference generating element.

Moreover, the semiconductor device further may include a differential amplifier and a bipolar transistor whose base is driven by an output from the differential amplifier. The gate electrode terminal of the first MOS capacitor and the diffusion layer terminal of the second MOS capacitor may be connected to the base of the bipolar transistor. Either of the terminals of the potential difference generating element may be connected to the collector of the bipolar transistor. The diffusion layer terminal of the first MOS capacitor may be connected to one of the terminals of the potential difference generating element. The gate electrode terminal of the second MOS capacitor may be connected to the other terminal of the potential difference generating element.

In the above configuration, a negative-feedback path may be provided from an intermediate point or either of the terminals of the potential difference generating element to the input of the differential amplifier.

Hereinafter, embodiments of the semiconductor device of the present invention will be described with reference to the drawings.

Embodiment 1

Figure 1:
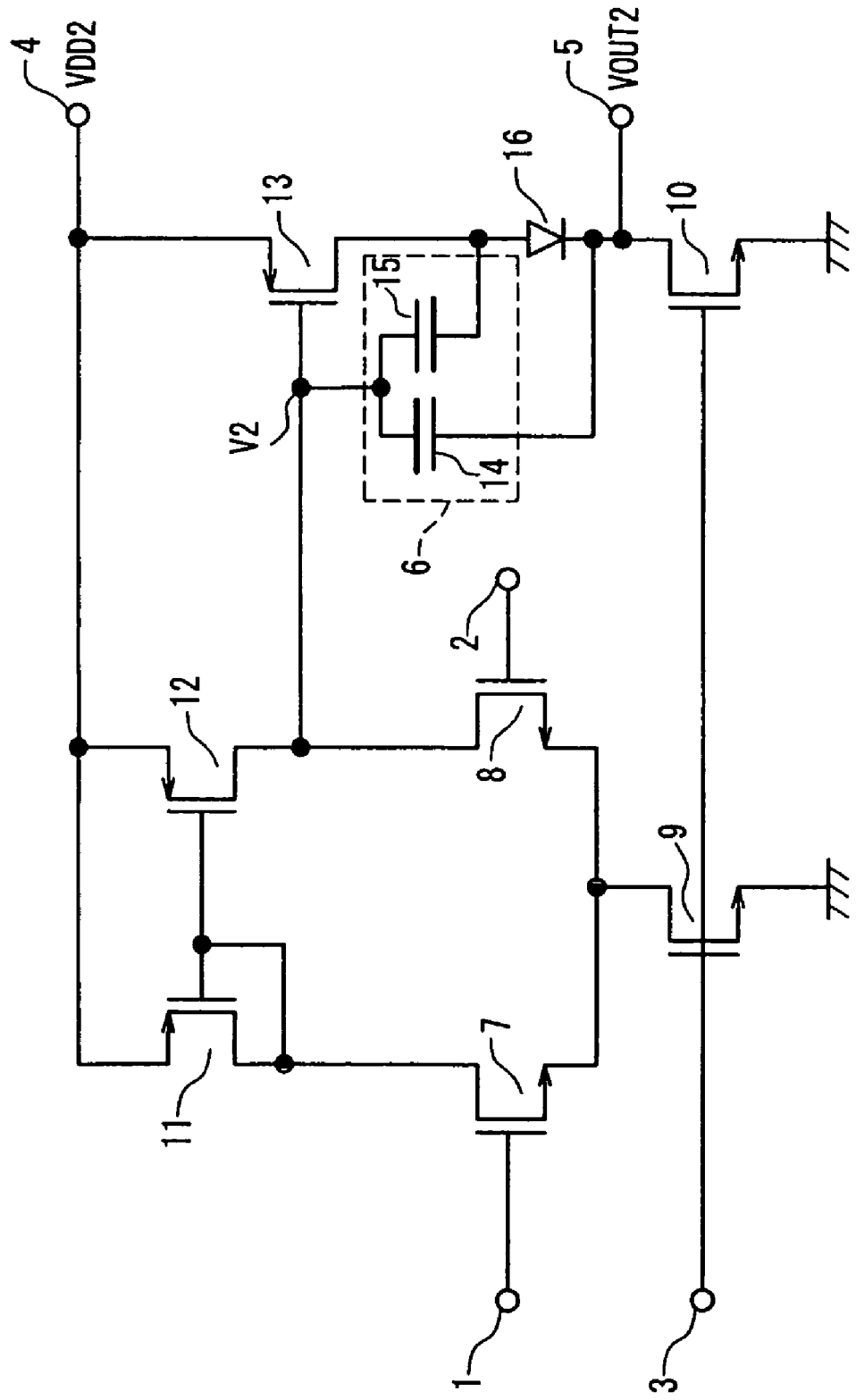
FIG. 1 is a circuit diagram of a semiconductor device of Embodiment 1 of the present invention.

FIG. 1 shows a semiconductor device of Embodiment 1 of the present invention. An N-channel MOS transistor 7 and an N-channel MOS transistor 8 constitute a differential input stage, and signals from an inverting input terminal 1 and a non-inverting input terminal 2 are input to the gates of the MOS transistors 7 and 8, respectively. The source of the MOS transistor 7 and the source of the MOS transistor 8 are connected to each other, and a constant current is drawn through the drain of an N-channel MOS transistor 9. In the MOS transistor 9, a drain current is set by a voltage applied to a bias voltage input terminal 3.

The sources of P-channel MOS transistors 11, 12 are connected to a common power supply terminal 4 (higher potential power supply VDD2). The drain of the MOS transistor 7 is connected to the gates of the MOS transistors 11, 12, and also to the drain of the MOS transistor 11. The drain of the MOS transistor 8 is connected to the drain of the MOS transistor 12. The drain of the MOS transistor 8 also is connected to the gate of a P-channel MOS transistor 13, whose source is connected to the higher potential power supply VDD2. The drain of the MOS transistor 13 is connected to an anode of a diode 16. A cathode of the diode 16 is connected to the drain of an N-channel MOS transistor 10 in which a drain current is set by the voltage applied to the bias voltage input terminal 3. The node between the cathode of the diode 16 and the drain of the MOS transistor 10 is connected to an output terminal 5.

A phase compensation capacitor 6 includes two MOS capacitors 14, 15 that are connected in parallel with their respective terminals of opposite polarities connected to each other. A gate electrode terminal of the MOS capacitor 14 and a diffusion layer terminal (i.e., the opposite terminal of the MOS capacitor to the gate electrode terminal) of the MOS capacitor 15 are connected to each other, and then connected to the node between the drain of the MOS transistor 8 and the gate of the MOS transistor 13. A gate electrode terminal of the MOS capacitor 15 is connected to the drain of the MOS transistor 13, and a diffusion layer terminal of the MOS capacitor 14 is connected to the drain of the MOS transistor 10.

V2 represents a gate voltage of the MOS transistor 13, and VOUT2 represents a voltage of the output terminal 5.

Figure 2:
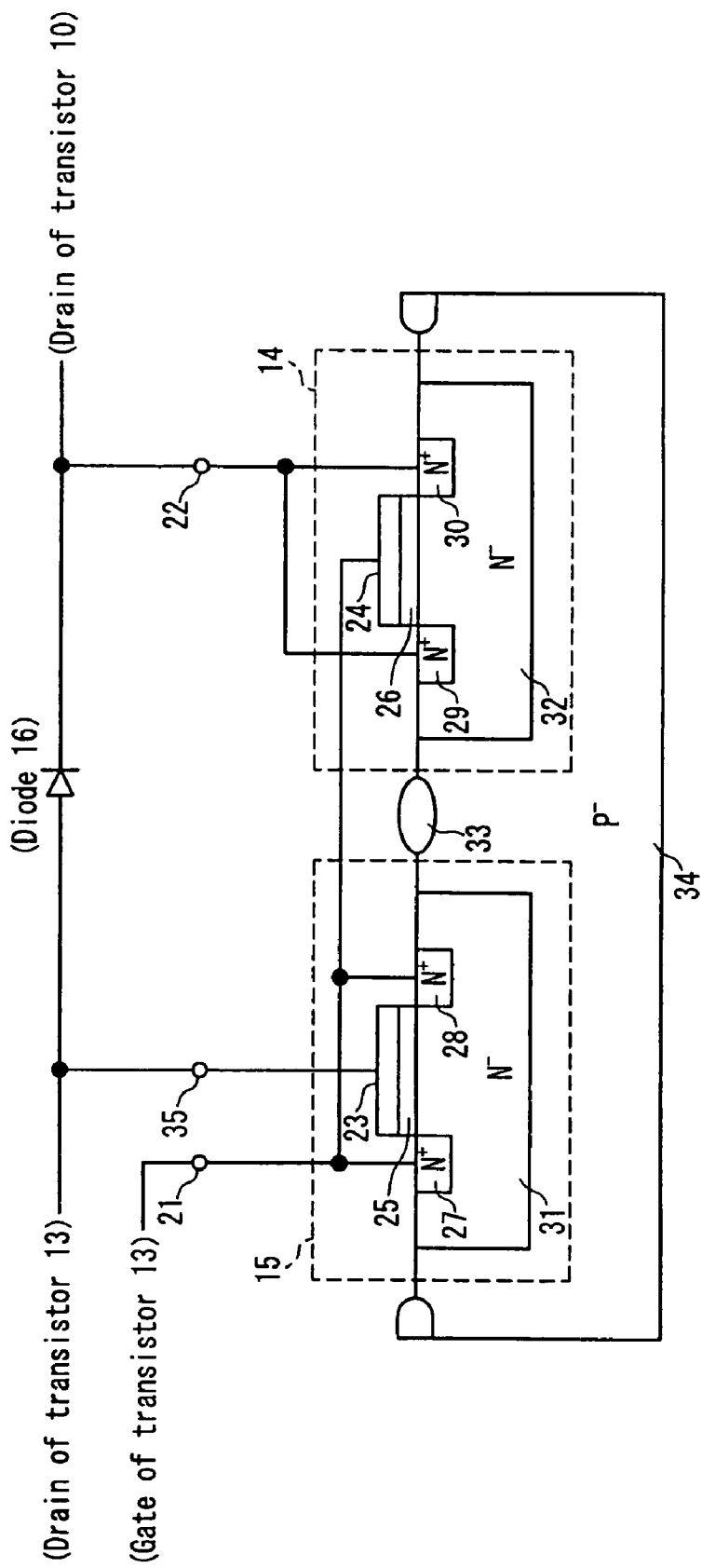
FIG. 2 is a cross-sectional view of MOS capacitors that constitute the semiconductor device of Embodiment 1.

FIG. 2 shows a cross-sectional structure of the MOS capacitors 14, 15 that serve as MOS-type capacitative elements (N well capacitative elements) constituting the phase compensation capacitor 6. Reference numeral 34 denotes a P-type semiconductor substrate in which N well layers (N-type diffusion layers having a low impurity concentration) 31, 32 and a field oxide film 33 are formed. N-type diffusion layers having a high impurity concentration (N-type diffusion layers with a small specific resistance) 27, 28 and 29, 30 are formed in the N well layers 31 and 32, respectively. A gate electrode 23 is disposed via a gate oxide film 25 in a region between the N-type diffusion layers 27 and 28. Similarly, a gate electrode 24 is disposed via a gate oxide film 26 in a region between the N-type diffusion layers 29 and 30. The gate electrodes 23, 24 are made of polysilicon.

Terminals 21, 22, and 35 are provided for the MOS capacitors 15, 14. As shown in FIG. 1, the diffusion layer terminal of the MOS capacitor 15 and the gate electrode terminal of the MOS capacitor 14 are connected to the gate of the MOS transistor 13 via the terminal 21. The diffusion layer terminal of the MOS capacitor 14 is connected to the drain of the MOS transistor 10 via the terminal 22. The gate electrode terminal of the MOS capacitor 15 is connected to the drain of the MOS transistor 13 via the terminal 35.

Figure 3:
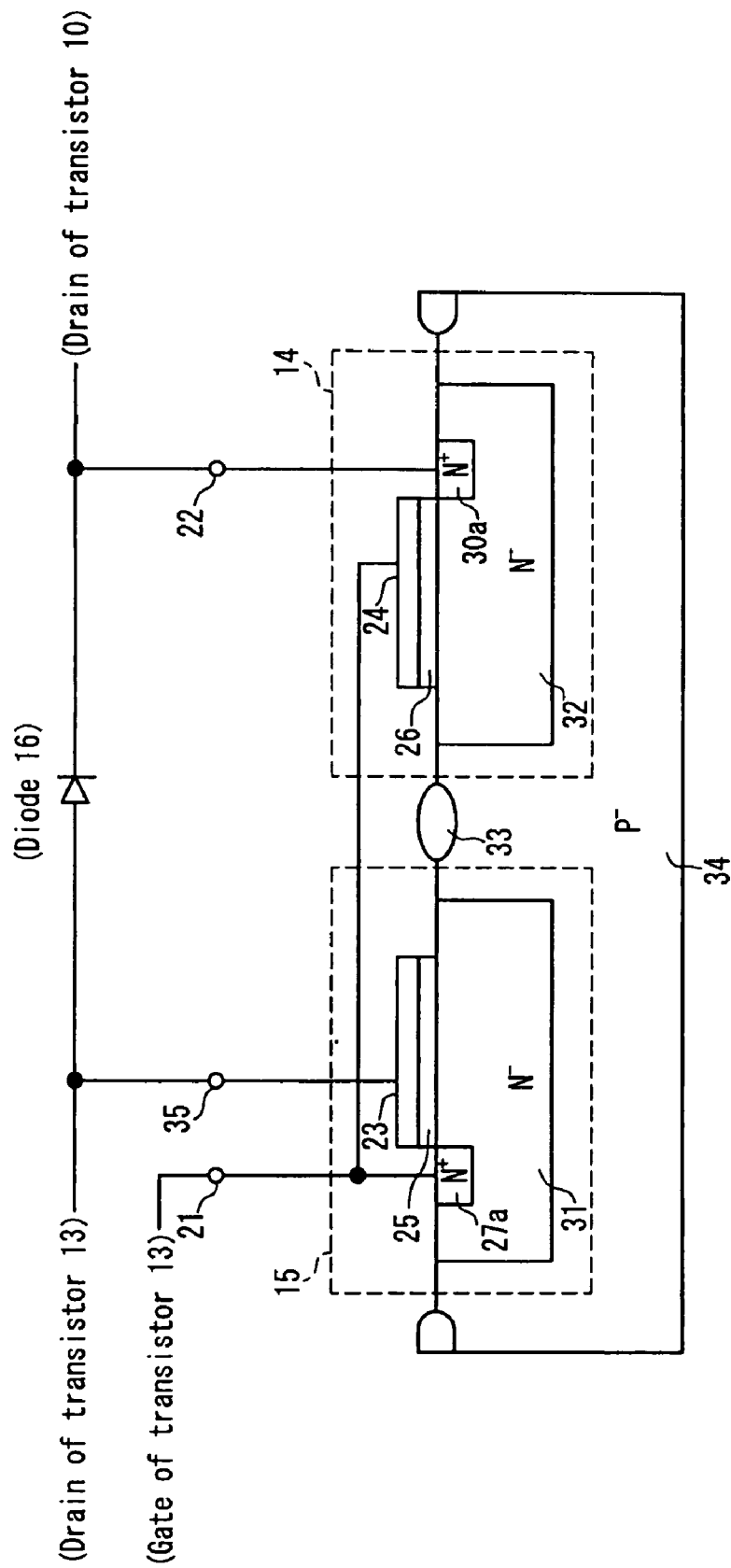
FIG. 3 is a cross-sectional view of other MOS capacitors that constitute the semiconductor device of Embodiment 1.

In the configuration of the MOS capacitors 15, 14 as shown in FIG. 2, the two N-type diffusion layers 27, 28 having a high impurity concentration are provided as contact portions of the N well diffusion layer 31 and the terminal 21 of the MOS capacitative element, while the two N-type diffusion layers 29, 30 having a high impurity concentration are provided as contact portions of the N well diffusion layer 32 and the terminal 22 of the MOS capacitative element. However, as shown in FIG. 3, the contact portion may be a single N-type diffusion layer (27a, 30a) for each of the MOS capacitors 15, 14 to increase the area S of the capacitor.

Figure 4:
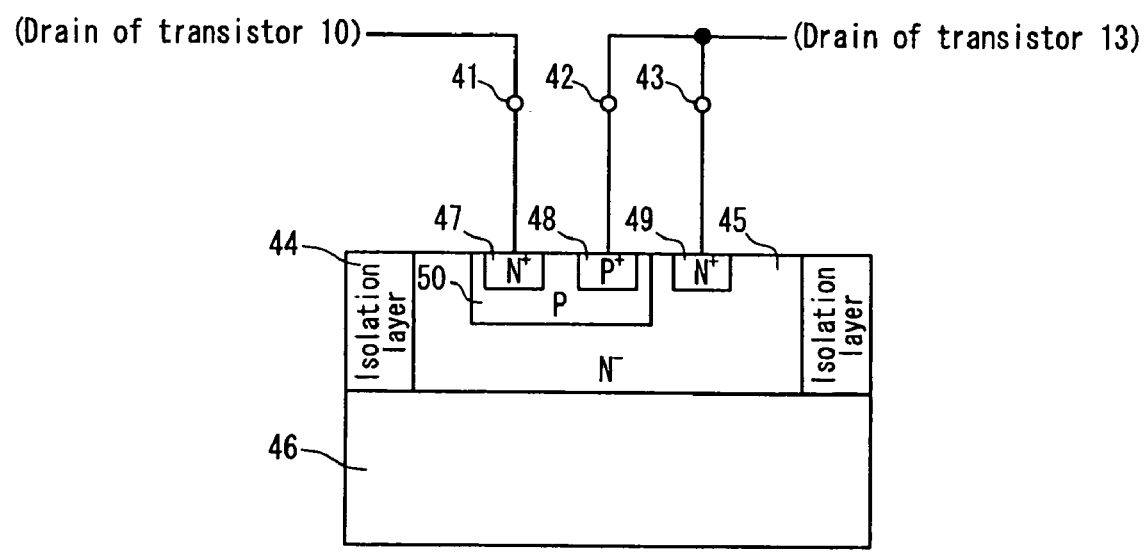
FIG. 4 is a cross-sectional view of a diode that constitutes the semiconductor device of Embodiment 1.

The diode 16 of FIG. 1 can be configured by using the PN junction of an NPN transistor, a PNP transistor, a MOS transistor, a Zener diode, etc. FIG. 4 shows the cross section of a diode composed of an NPN transistor as an example.

In FIG. 4, reference numeral 46 is a P-type semiconductor substrate on which an N well layer 45 is formed. The N well layer 45 is isolated by P-type isolation layers 44. A P-type diffusion layer 50 and an N-type diffusion layer 49 having a high impurity concentration are formed in the N well layer 45. Moreover, an N-type diffusion layer 47 having a high impurity concentration and a P-type diffusion layer 48 having a high impurity concentration are formed in the P-type diffusion layer 50. An emitter terminal 41, a base terminal 42, and a collector terminal 43 are connected to the N-type diffusion layer 47, the P-type diffusion layer 48, and the N-type diffusion layer 49, respectively. As shown in FIG. 4, the node between the base terminal 42 and the collector terminal 43 serves as an anode and the emitter terminal 41 serves as a cathode, thus forming the diode.

Figure 5:
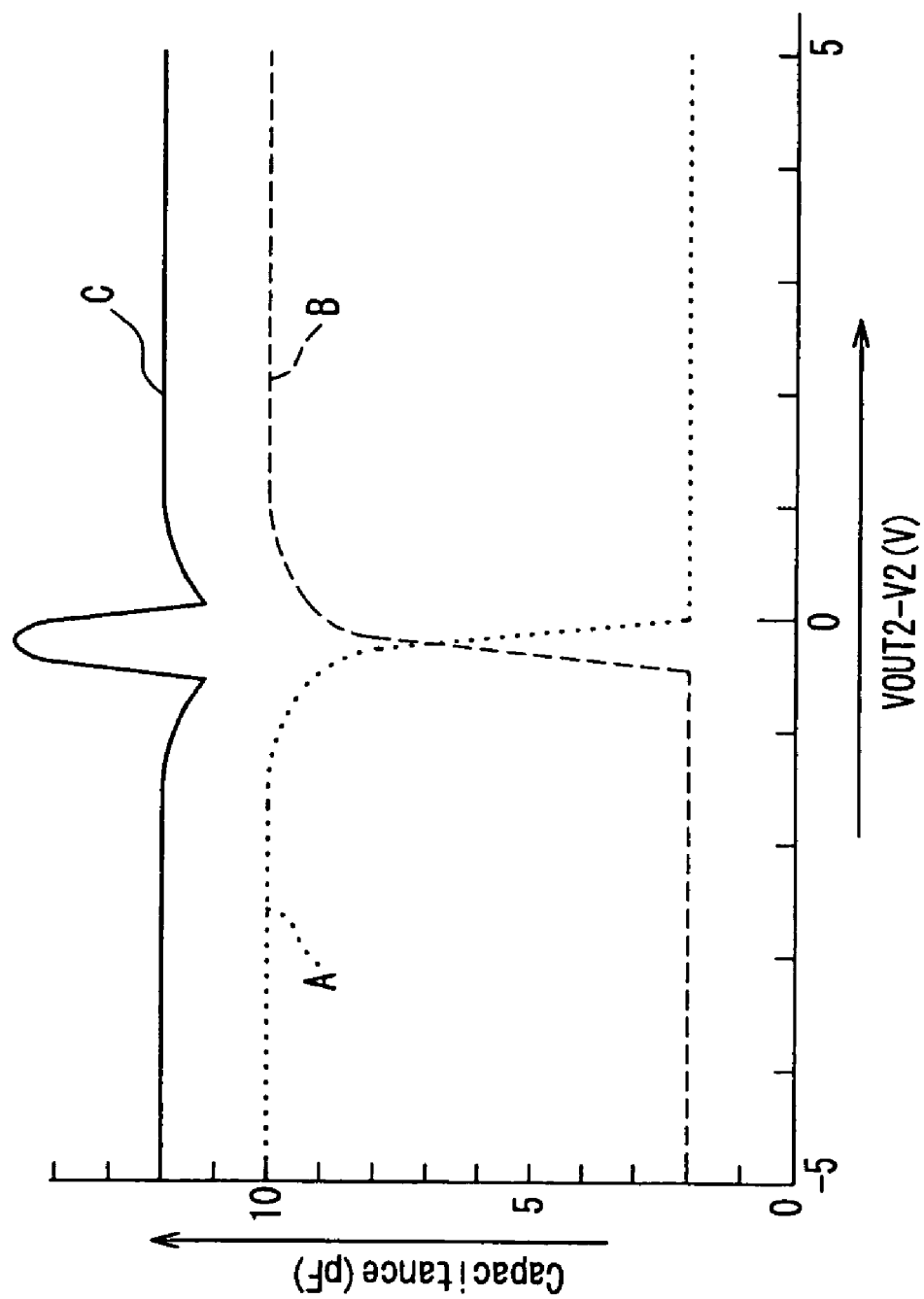
FIG. 5 is a characteristic diagram showing the voltage dependence of MOS capacitors that constitute the semiconductor device of Embodiment 1.

FIG. 5 is a characteristic diagram showing the voltage dependence of the phase compensation capacitor 6. The horizontal axis indicates a voltage (VOUT2-V2), and the vertical axis indicates a capacitance (pF). In a general MOS capacitor, if the voltage of the diffusion layer terminal is higher than that of the gate electrode terminal, a depletion layer is formed in the N well layer directly below the gate electrode. Consequently, the length L as the capacitor in combination with the thickness of the gate oxide film is increased to reduce the capacitance. The characteristics of the MOS capacitor 14 are represented by a dotted-line curve A, the characteristics of the MOS capacitor 15 are represented by a broken-line curve B, and the capacitance of the phase compensation capacitor 6 (i.e., the total capacitance of the MOS capacitors 14, 15) are represented by a solid-line curve C, while a small variation of the voltage dependence of the MOS capacitor may be caused according to the conditions of the impurity concentration of the N well layer, the thickness of the gate oxide film, or the like.

FIG. 5 shows the characteristics of the voltage dependence of the phase compensation capacitor 6 in the range of (VOUT2-V2) from −5 V to 5 V. For example, if the voltage of the higher potential power supply VDD2 is 5 V, the variable range of (VOUT2-V2) is about −5 V to about 4.3 V in the actual circuit operation.

As can be seen from FIG. 5, a potential difference (about 0.7 V) is generated between the gate electrode terminal of the MOS capacitor 15 and the diffusion layer terminal of the MOS capacitor 14 because of the presence of the diode 16. Therefore, no matter what value (VOUT2-V2) takes depending on the operating conditions, the voltage between the terminals of the MOS capacitor 14 and the voltage between the terminals of the MOS capacitor 15 are not simultaneously in the vicinity of 0 V. In other words, the capacitances of the MOS capacitors 14, 15 are not significantly reduced at the same time due to the influence of the depletion layer, so that the total capacitance of the MOS capacitors 14, 15 always can be maintained at a predetermined value or more.

Thus, e.g., when the semiconductor device of FIG. 1 is provided with a feedback path so as to be used as an operational amplifier, the phase margin is always maintained by the MOS capacitors 14, 15, no matter what value (VOUT2-V2) takes depending on the operating conditions. Thus, the operational amplifier will not tend to oscillate.

As shown in FIG. 5, the total capacitance of the MOS capacitors 14, 15 (the curve C) is not reduced significantly, but always maintained at a predetermined value or more. Therefore, the MOS capacitors 14, 15 do not have to be made larger than required, and the phase margin can be maintained without increasing the chip size unnecessarily.

In the semiconductor device of FIG. 1, the diode 16 through which a constant current flows is interposed between the gate electrode terminal of the MOS capacitor 15 and the diffusion layer terminal of the MOS capacitor 14 so as to generate a potential difference. Instead, the potential difference also can be generated by using a resistor instead of the diode 16, although the AC characteristics of the operational amplifier may differ slightly. Moreover, a resistor may be inserted in series with the diode 16, and the potential difference can be finely adjusted by the setting of a resistance. Further, two diodes may be connected in series, and the total capacitance of the MOS capacitors 14, 15 can be increased in a wide voltage range where (VOUT2-V2) is in the vicinity of 0 V on the premise that the output D range of the operational amplifier may become narrower.

By providing a negative-feedback path from the anode or cathode of the diode 16 to the inverting input terminal 1 in FIG. 1, the semiconductor device can be used for various types of operational amplifiers that maintain the phase margin regardless of the input voltage conditions. When a plurality of resistors or diodes are connected in series instead of the diode 16, the negative-feedback path may be provided from an intermediate point as well as the terminals at both ends to the inverting input terminal 1.

As is evident from the above explanation, in the semiconductor device of Embodiment 1 of the present invention, no matter what value (VOUT2-V2) takes depending on the operating conditions, and particularly even if (VOUT2-V2) is in the vicinity of 0 V, the total capacitance of the MOS capacitors 14, 15 can be maintained at a predetermined value or more, so that the phase margin of the operational amplifier can be maintained. Thus, the operational amplifier will not tend to oscillate.

As shown in FIG. 2, the semiconductor device of this embodiment uses the MOS capacitors, one including the gate oxide film 25 disposed between the gate electrode 23 and the N well layer 31, and the other including the gate oxide film 26 disposed between the gate electrode 24 and the N well layer 32. This embodiment also can be applied similarly to a MOS capacitor including a gate oxide film disposed between a gate electrode and a P well layer. In such a case, contrary to the MOS capacitors of FIG. 2, if the voltage of the gate electrode terminal is higher than that of the diffusion layer terminal, a large depletion layer (the length L is long in the vertical direction) is formed in the P well layer directly below the gate electrode. Consequently, the capacitance of the MOS capacitor is reduced significantly. For this reason, the MOS capacitors 14, 15 in the configuration of FIG. 1 should be connected to each other with the polarities reversed.

Embodiment 2

A semiconductor device of Embodiment 2 of the present invention will be described with reference to FIG. 6. This semiconductor device is an operational amplifier including a bipolar transistor, a MOS capacitor, a diode, and a resistor. Moreover, the semiconductor device is a circuit example that is intended to buffer an input voltage (namely, to increase the current capacity) by providing a negative feedback from an output terminal to an inverting input terminal.

Figure 6:
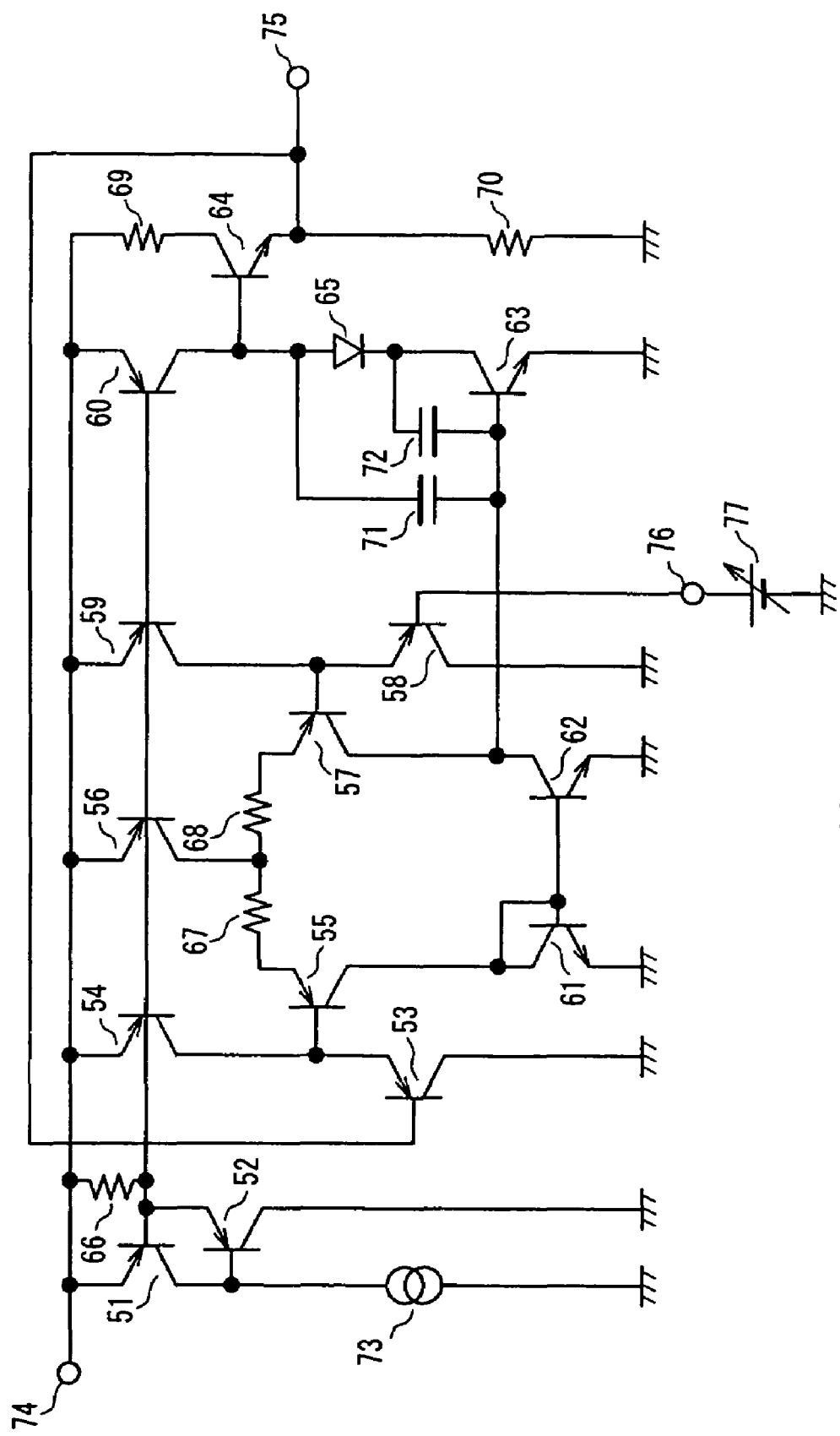
FIG. 6 is a circuit diagram of a semiconductor device of Embodiment 2 of the present invention.
Figure 7:
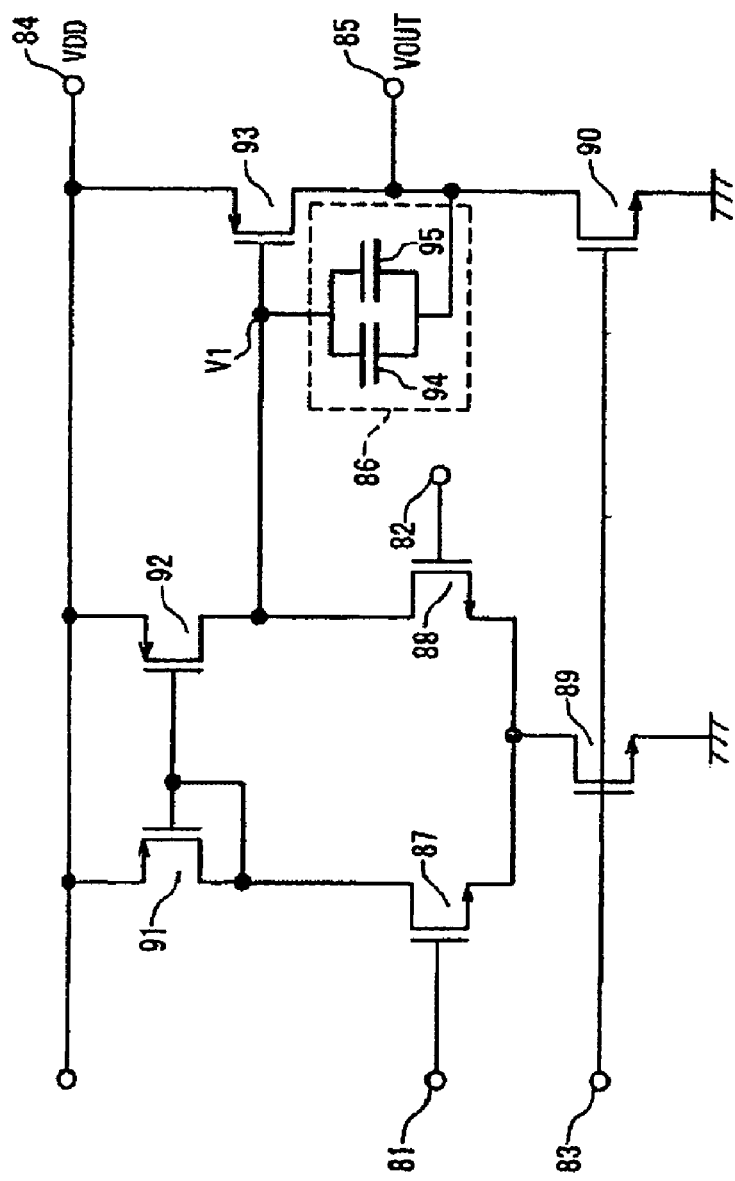
FIG. 7 is a circuit diagram of a conventional semiconductor device.
Figure 8:
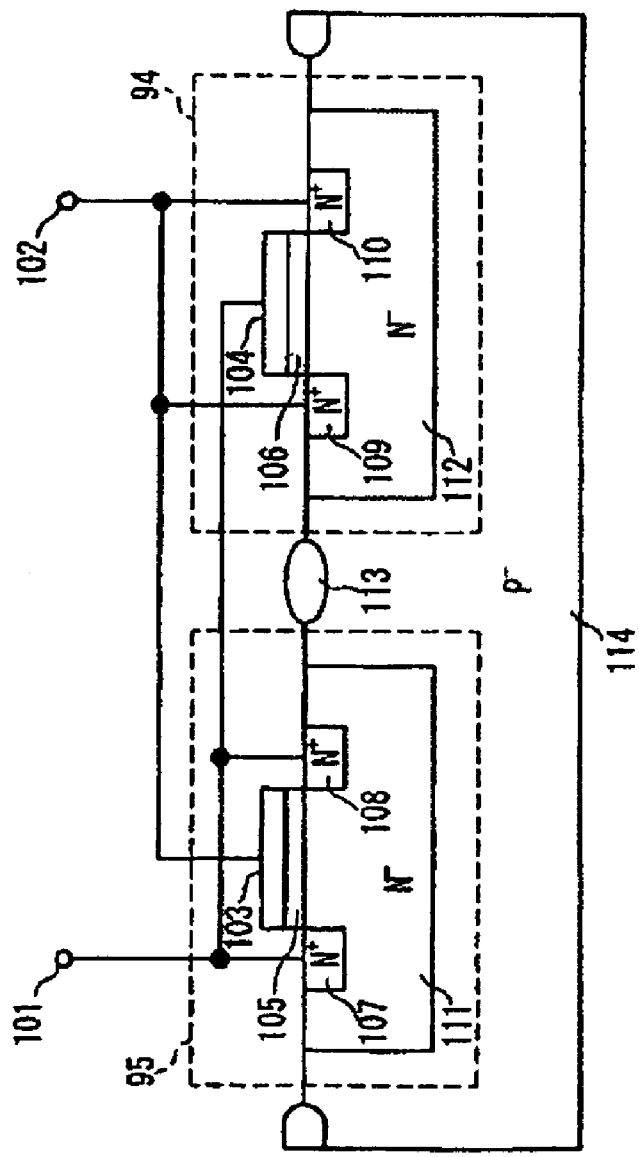
FIG. 8 is a cross-sectional view of MOS capacitors that constitute the conventional semiconductor device.
Figure 9:
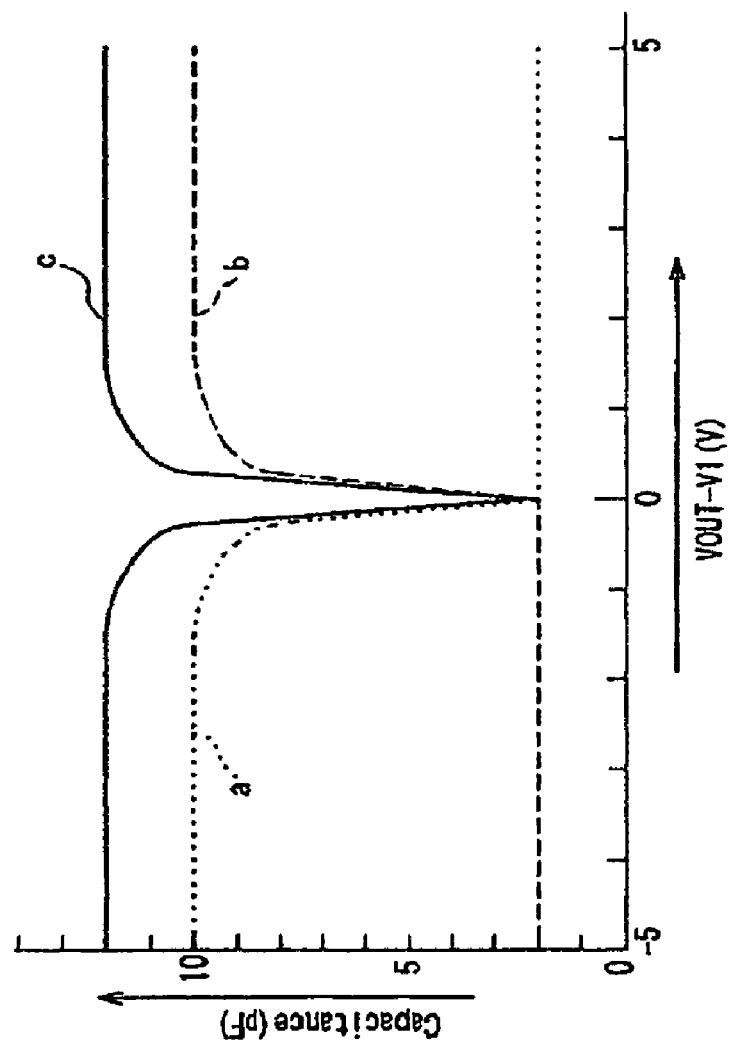
FIG. 9 is a characteristic diagram showing the voltage dependence of MOS capacitors that constitute the conventional semiconductor device.

In FIG. 6, reference numerals 51 to 60 denote PNP transistors, 61 to 64 denote NPN transistors, 65 denotes a diode, 66 to 70 denote resistors, 71 and 72 denote MOS capacitors, 73 denotes a constant current source, 74 denotes a higher potential power supply, 75 denotes an output terminal, 76 denotes a non-inverting input terminal, and 77 denotes a variable power supply. The MOS capacitors 71, 72 may have a configuration in which a gate oxide film is disposed between a gate electrode and a P well layer. In this embodiment, however, the MOS capacitors 71, 72 are configured by disposing a gate oxide film between a gate electrode and an N well layer, as shown in FIG. 2 or 3.

A constant current controlled by a current mirror operation based on a constant current of the current source 73 flows from the collectors of the PNP transistors 54, 56, 59, and 60.

The base of the PNP transistor 53 is an inverting input terminal, and the base of the PNP transistor 58 is a non-inverting input terminal. The PNP transistors 53, 55, 57, and 58 constitute a differential input stage. The resistors 67, 68 are used for gain control of the operational amplifier. The collector of the PNP transistor 55 is connected to the collector of the NPN transistor 61 whose emitter is grounded. The base of the NPN transistor 61 is connected to the collector, and also to the base of the NPN transistor 62 whose emitter is grounded. The collector of the NPN transistor 62 is connected to the collector of the PNP transistor 57, and the node between them is connected to the base of the NPN transistor 63 whose emitter is grounded.

A diffusion layer terminal of the MOS capacitor 71 and a gate electrode terminal of the MOS capacitor 72 are connected to the base of the NPN transistor 63. A diffusion layer terminal of the MOS capacitor 72 is connected to the collector of the NPN transistor 63, and the node between them is connected to a cathode of the diode 65. An anode of the diode 65 is connected to a gate electrode terminal of the MOS capacitor 71, the collector of the PNP transistor 60, and the base of the NPN transistor 64. The collector of the NPN transistor 64 is connected to the higher potential power supply 74 via a small resistor 69 for overcurrent protection. The emitter of the NPN transistor 64 is connected to one terminal of a resistor 70 in which the other terminal is grounded, and also to the output terminal 75. The node between the emitter of the NPN transistor 64 and the output terminal 75 is connected further to the base of the PNP transistor 53 (the inverting input terminal) as a negative-feedback path. The variable power supply 77 is connected to the non-inverting input terminal 76.

The above configuration can provide a circuit in which the voltage of the variable power supply 77 is buffered (namely, the current capacity is increased) at the output terminal 75. As with the semiconductor device of Embodiment 1, a potential difference (about 0.7 V) is generated between the gate electrode terminal of the MOS capacitor 71 and the diffusion layer terminal of the MOS capacitor 72 because of the presence of the diode 65. Therefore, the voltage between the terminals of the MOS capacitor 71 and the voltage between the terminals of the MOS capacitor 72 are not simultaneously in the vicinity of 0 V.

For example, assuming that equivalently the voltage between the base and the emitter of each of the NPN transistors 63, 64 is 0.7 V, the voltage between the terminals of the diode 65 is 0.7 V, and a saturation voltage of the NPN transistor 63 is 0 V (although, the actual voltage is slightly higher), when the output terminal 75 is 0 V, the voltage between the terminals of the MOS capacitor 71 becomes 0 V, and the capacitance is reduced significantly due to the influence of a depletion layer. However, the voltage between the terminals of the MOS capacitor 72 becomes 0.7 V (i.e., the gate electrode terminal is at a higher potential), and the capacitance is not reduced significantly. Therefore, the total capacitance of the MOS capacitors 71, 72 can be maintained at a predetermined value or more, so that the phase margin can be maintained. Thus, even the operational amplifier with a negative feedback will not oscillate.

In the absence of the diode 65, like the conventional configuration, when the output terminal 75 is 0 V, both the voltage between the terminals of the MOS capacitor 71 and the voltage between the terminals of the MOS capacitor 72 become 0 V, and thus the total capacitance of the MOS capacitors 71, 72 is extremely small. Even if any small parasitic capacitance is added in addition to the MOS capacitors 71, 72, the total capacitance remains small when the output terminal 75 is in the vicinity of 0 V, compared to the other voltage range higher than the vicinity of 0 V. Therefore, a large capacitor is required to maintain sufficient phase margin while the output terminal is in the vicinity of 0 V.

In the semiconductor device of Embodiment 2 of the present invention, as described above, no matter what value the voltage of the variable power supply 77 takes (or no matter what value the voltage of the output terminal 75 takes), the total capacitance of the MOS capacitors 71, 72 is not reduced significantly. Therefore, as with the characteristics of the semiconductor device of Embodiment 1 shown in FIG. 5, the total capacitance of the MOS capacitors 71, 72 can always be maintained at a predetermined value or more. Thus, the phase margin of the operational amplifier also can always be maintained at a predetermined value or more.

FIG. 5 shows the characteristics of the voltage dependence of the phase compensation capacitor 6 in the range of (VOUT2-V2) from −5 V to 5 V in the semiconductor device of Embodiment 1 shown in FIG. 1. With respect to the semiconductor device of Embodiment 2 shown in FIG. 6, similar characteristics are obtained when the collector of the NPN transistor 63 is considered to be VOUT2 and the base of the NPN transistor 63 is considered to be V2. In the characteristics of the voltage dependence of the phase compensation capacitor shown in FIG. 5, the MOS capacitor 15, the MOS capacitor 14, and the total capacitance of the MOS capacitors 14, 15 (FIG. 1) correspond to the MOS capacitor 71, the MOS capacitor 72, and the total capacitance of the MOS capacitors 71, 72 (FIG. 6), respectively.

Although FIG. 5 shows the characteristics of the voltage dependence of the phase compensation capacitor in the range of (VOUT2-V2) from −5 V to 5 V, the circuit of FIG. 6 differs from the circuit of FIG. 1 in that, e.g., if the voltage of the higher potential power supply 74 is 5 V, the voltage between the collector and the base of the NPN transistor 63, that is, the variable range of (VOUT2-V2) is about −0.7 V to about 3.6 V in the actual circuit operation.

In the conventional configuration that does not include the diode 65, even if the input voltage range of the variable power supply 77 is limited to the range where the voltage between the terminals of each of the MOS capacitors is not in the vicinity of 0 V, the MOS capacitors are still in the vicinity of 0 V temporarily during power-up or shutdown. Therefore, the operational amplifier oscillates temporarily, which may cause abnormal conditions in the system that uses this operational amplifier. However, the insertion of the diode 65 can eliminate such abnormal conditions of the system upon power-up or shutdown.

In the configuration of FIG. 6, a negative-feedback path is provided from the anode of the diode 65 to the base of the PNP transistor 53. The negative-feedback path also may be provided from the cathode of the diode 65. Alternatively, when a plurality of resistors or diodes are connected in series instead of the diode 65, the negative-feedback path may be provided from an intermediate point as well as the terminals at both ends to the base of the PNP transistor 53.

As is evident from the above explanation, in the semiconductor device of Embodiment 2 of the present invention, either if the operational amplifier includes bipolar elements and an actual negative-feedback path, or no matter what value the voltage between the collector and the base of the NPN transistor 63 takes depending on the operating conditions, and particularly even if the voltage between the collector and the base of the NPN transistor 63 is in the vicinity of 0 V, the total capacitance of the MOS capacitors 71, 72 can be maintained at a predetermined value or more, so that the phase margin of the operational amplifier can be maintained. Thus, the oscillation of the operational amplifier is suppressed.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device comprising a phase compensation circuit using a MOS capacitor with a structure in which an insulating film is disposed between a gate electrode formed on a semiconductor substrate and a diffusion layer, wherein the phase compensation circuit comprises a first MOS capacitor and a second MOS capacitor, a gate electrode terminal of the first MOS capacitor is connected to a diffusion layer terminal of the second MOS capacitor that is a terminal opposite to the gate electrode terminal, and a potential difference generating element that generates a potential difference by allowing a current to flow therethrough is connected between a diffusion layer terminal of the first MOS capacitor and a gate electrode terminal of the second MOS capacitor.

2. The semiconductor device according to claim 1, wherein a diode is provided as the potential difference generating element, and a forward current is allowed to flow through the diode.

3. The semiconductor device according to claim 1, wherein the phase compensation circuit is used for phase compensation of an operational amplifier.

4. The semiconductor device according to claim 3, further comprising:

a differential amplifier; and a MOS transistor whose gate is driven by an output from the differential amplifier, wherein the gate electrode terminal of the first MOS capacitor and the diffusion layer terminal of the second MOS capacitor are connected to the gate of the MOS transistor, either of terminals of the potential difference generating element is connected to a drain of the MOS transistor, the diffusion layer terminal of the first MOS capacitor is connected to one of the terminals of the potential difference generating element, and the gate electrode terminal of the second MOS capacitor is connected to the other terminal of the potential difference generating element.

5. The semiconductor device according to claim 3, further comprising:

a differential amplifier; and a bipolar transistor whose base is driven by an output from the differential amplifier, wherein the gate electrode terminal of the first MOS capacitor and the diffusion layer terminal of the second MOS capacitor are connected to the base of the bipolar transistor, either of terminals of the potential difference generating element is connected to a collector of the bipolar transistor, the diffusion layer terminal of the first MOS capacitor is connected to one of the terminals of the potential difference generating element, and the gate electrode terminal of the second MOS capacitor is connected to the other terminal of the potential difference generating element.

6. The semiconductor device according to claim 4, wherein a negative-feedback path is provided from an intermediate point or either of the terminals of the potential difference generating element to an input of the differential amplifier.

7. The semiconductor device according to claim 5, wherein a negative-feedback path is provided from an intermediate point or either of the terminals of the potential difference generating element to an input of the differential amplifier.

* * * * *